(12) United States Patent
Zhang et al.

(10) Patent No.: US 12,379,534 B2
(45) Date of Patent: Aug. 5, 2025

(54) COVER FOR AN INFRARED DETECTOR AND A METHOD OF FABRICATING A COVER FOR AN INFRARED DETECTOR

(71) Applicant: Meridian Innovation Pte Ltd, Singapore (SG)

(72) Inventors: Xintong Zhang, Shenzhen (CN); Wei Zhou, Pak Shek Kok (HK); Ilker Ender Ocak, Singapore (SG); He Li, Pak Shek Kok (HK)

(73) Assignee: Meridian Innovation Pte Limited, Singapore (SG)

( * ) Notice: Subject to any disclaimer, the term of this patent is extended or adjusted under 35 U.S.C. 154(b) by 669 days.

(21) Appl. No.: 17/539,210

(22) Filed: Dec. 1, 2021

(65) Prior Publication Data

US 2023/0084280 A1    Mar. 16, 2023

Related U.S. Application Data

(63) Continuation-in-part of application No. 17/612,200, filed on Nov. 17, 2021, and a continuation-in-part of
(Continued)

(51) Int. Cl.
*B81B 7/00* (2006.01)
*B81C 1/00* (2006.01)
*G02B 5/20* (2006.01)

(52) U.S. Cl.
CPC ............ *G02B 5/208* (2013.01); *B81B 7/0058* (2013.01); *B81C 1/00333* (2013.01);
(Continued)

(58) Field of Classification Search
None
See application file for complete search history.

(56) References Cited

U.S. PATENT DOCUMENTS

| 2008/0277672 A1* | 11/2008 | Hovey | ................... G02B 1/118 |
| | | | 257/E21.705 |
| 2012/0097415 A1* | 4/2012 | Reinert | ............. H01L 27/14683 |
| | | | 174/50 |
| 2021/0402721 A1* | 12/2021 | Pranov | .................... C03C 15/00 |

FOREIGN PATENT DOCUMENTS

| KR | 102089866 B1 | 4/2020 |
| WO | 2020204835 A1 | 10/2020 |
| WO | 2020242384 A1 | 12/2020 |

* cited by examiner

*Primary Examiner* — Michael Lebentritt
(74) *Attorney, Agent, or Firm* — HORIZON IP PTE LTD.

(57) ABSTRACT

A cover for an infrared detector and a method of fabricating the cover are disclosed. The cover comprises a wafer comprising a material such as silicon that transmits infrared radiation. The wafer has a first surface and a second surface opposite the first surface. An antireflective region is formed in the wafer to enhance transmission of infrared radiation through the cover. The antireflective region comprises a first plurality of antireflective elements such as moth-eyes formed in the first surface. The first plurality of antireflective elements are sized and shaped and arranged relative to one another to form a region of graded refractive index at the first surface so as to reduce the amount of infrared radiation reflected by the cover at the antireflective region. The cover comprises a wall extending from the first surface and surrounding the antireflective region. The wall comprises a plurality of layers of material deposited on the wafer so that, when the cover is bonded to a sensor substrate via the wall, a cavity is formed that encapsulates a sensor region of the sensor substrate. The depth of the cavity may be adjusted by depositing the plurality of layers of material with a combined thickness equivalent to the desired depth of the cavity. A second plurality of antireflective elements may be formed (Continued)

in the second surface to enhance the antireflective properties of the antireflective region.

21 Claims, 13 Drawing Sheets

Related U.S. Application Data application No. 17/440,784, filed on Sep. 19, 2021, and a continuation-in-part of application No. 17/440,175, filed on Sep. 16, 2021, now Pat. No. 11,845,653, and a continuation-in-part of application No. 17/439,797, filed on Sep. 15, 2021.

(52) U.S. Cl.
CPC .............. *B81B 2201/0207* (2013.01); *B81B 2203/0127* (2013.01); *B81C 2201/0133* (2013.01); *B81C 2203/0118* (2013.01)

Trigonal pattern

Quadratic pattern

COVER FOR AN INFRARED DETECTOR AND A METHOD OF FABRICATING A COVER FOR AN INFRARED DETECTOR

CROSS-REFERENCE TO RELATED APPLICATIONS

This application cross-references to U.S. patent application Ser. No. 17/156,639, filed on Jan. 25, 2021, which is a continuation of U.S. patent application Ser. No. 16/809,561, titled CMOS Cap for MEMS Devices, now U.S. Pat. No. 10,923,525, filed on Mar. 5, 2020, which is a continuation-in-part application of U.S. patent application Ser. No. 16/517,653, now U.S. Pat. No. 10,903,262, filed on Jul. 21, 2019, which is a continuation application of U.S. patent application Ser. No. 15/647,284, titled Scalable Thermoelectric-based Infrared Detector, now U.S. Pat. No. 10,403,674, filed on Jul. 12, 2017. Said U.S. patent application Ser. No. 17/156,639, is also a continuation-in-part application of U.S. patent application Ser. No. 16/224,782, now U.S. Pat. No. 10,937,824, filed on Dec. 18, 2018, which is a divisional application of U.S. patent application Ser. No. 15/653,558, titled Thermoelectric-based Infrared Detector with high CMOS Integration, now U.S. Pat. No. 10,199,424, filed on Jul. 19, 2017.

This application also cross-references to U.S. patent application Ser. No. 17/141,232, filed on Jan. 5, 2021, which is a continuation application of above said U.S. patent application Ser. No. 16/517,653, now U.S. Pat. No. 10,903,262, filed on Jul. 21, 2019.

This application further cross-references to U.S. patent application Ser. No. 17/440,175, filed on Sep. 16, 2021, which is a 371 US application of PCT International Application Ser. No. PCT/SG2020/050202, which claims the benefit of U.S. Provisional Application No. 62/827,207, filed on Apr. 1, 2019.

This application further cross-references to U.S. patent application Ser. No. 17/440,784, filed on Sep. 19, 2021, which is a 371 US application of PCT International Application Ser. No. PCT/SG2020/050201, which claims the benefit of U.S. Provisional Application No. 62/827,205, filed on Apr. 1, 2019.

This application further cross-references to U.S. patent application Ser. No. 17/439,797, filed on Sep. 15, 2021, which is a 371 US application of PCT International Application Ser. No. PCT/SG2020/050203, which claims the benefit of U.S. Provisional Application No. 62/827,861, filed on Apr. 2, 2019.

This application further cross-references to U.S. patent application Ser. No. 17/612,200, filed on Nov. 17, 2021, which is a 371 US application of PCT International Application Ser. No. PCT/SG2020/050311, which claims the benefit of U.S. Provisional Application No. 62/854,319, filed on May 30, 2019.

The disclosure of all of which are herein incorporated by reference in their entireties for all purposes.

TECHNICAL FIELD

The present invention relates to a cover for an infrared detector and a method of fabricating a cover for an infrared detector.

BACKGROUND OF THE INVENTION

Infrared (IR) detectors are designed for non-contact temperature detection and have a wide range of commercial and industrial applications where detection of thermal radiation is required.

There are two categories of IR detectors, uncooled IR detectors and cryogenically cooled IR detectors. Uncooled IR detectors, whilst less sensitive than cooled IR detectors, are increasingly popular because they achieve acceptable levels of sensitivity and have several advantages over cooled IR detectors such as relatively lower in cost, simplicity, and higher portability. Examples of uncooled IR detectors are described in US20190148424A1 which discloses a device including a substrate with a transistor component disposed in a transistor region and a micro-electrical mechanical system (MEMS) component disposed on a membrane over a lower sensor cavity in a hybrid region. The MEMS component serves as a thermoelectric-based infrared sensor and is protected by a cap wafer or cover that encapsulates both the transistor region and the hybrid region.

The cover is provided to minimise contamination and degradation of the IR sensor and to protect it from damage from the external environment. As described in US20190148424A1, the region of the cover extending across the IR sensor must be substantially IR transparent to allow for IR radiation to pass through the cover and fall on the IR detector array. Accordingly, the cover may comprise a silicon (Si) wafer for IR transparency and include an anti-reflective region to reduce the reflection of infrared radiation at the silicon wafer surface. The anti-reflective region may include a bottom grating on the inner (bottom) surface of the cover and a top grating on the outer (top) surface of the cover. The gratings can have a moth-eye grating pattern or structure to facilitate transmission of infrared radiation. Alternatively, the bottom and top surfaces of the cover may include an antireflective coating made from an antireflective material such as zinc sulphide (ZnS) or germanium (Ge).

Providing antireflective gratings or coatings on both the top and bottom surfaces of the antireflective region improves IR transmittance through the Si wafer and, therefore, renders the Si wafer more transparent to IR radiation so as to enhance the sensitivity of the IR sensor. A problem with using an antireflective coating, though, is that it cannot adequately endure the high temperature process used for the thermal bonding procedure for vacuum packaging. Consequently, it is preferable to use wet or dry etching methods on the cover to form antireflective moth-eye structures that are more thermally stable and capable of withstanding the thermal bonding procedure during manufacture. However, the moth-eye structures formed in the antireflective region of the cover are inherently small and delicate and, therefore, prone to damage during manufacture, particularly when forming such structures on both the top and bottom surfaces of the cover. Additionally, it is desirable for the cover and sensor substrate to form a deep cavity so that an improved vacuum can be attained for improved detector sensitivity.

One method of fabricating a cover with the desired antireflective elements in a deep cavity is depicted in FIG. 1 and involves, in a first step 101, etching a silicon wafer using a deep reactive-ion etching (DRIE) technique to form a deep cavity. In a second step 102, a plurality of antireflective elements may then be formed in the base of the cavity by masking the base with a desired pattern. In a third step 103, an etching procedure is carried out to remove exposed areas of the cavity base to form a field of antireflective elements in the cavity base and thereby form a cover 105 with an antireflective region. In theory, this masking and etching technique should result in a uniform array of antireflective elements being formed in the base of the cavity to further enhance the transmissibility of the cover.

However, with reference to FIG. 2, applying a uniform mask to the base of a deep cavity is difficult and typically results in a non-uniform array of antireflective elements being formed that is not capable of achieving a desired antireflective effect for enhanced IR transmittance. This is due, at least in part, to the relatively long focal depth required during the lithography process. For example, when attempting to form an array in a deep cavity of between 100 µm and 300 µm, the lithography equipment used is incapable of focusing UV radiation at such focal lengths with sufficient accuracy to form a uniform pattern of relatively tiny ~1-2 µm moth eye structures with desired antireflective properties.

U.S. Pat. No. 6,838,306 B2 discloses an alternative fabrication method in which the steps for forming the cavity and antireflective elements are reversed. An infrared detector is disclosed comprising a window formed in a cover having a cavity for exposing detector pixels to incident radiation. The window has an antireflective element formed within the cavity as a field of posts. The field of post structures is formed in a cavity by first etching the posts in a desired pattern and then, second, forming the cavity by a general etch over the whole field of posts. Because the tops of the posts and the ground surface of the field are etched substantially equally, the effect is to sink the field of posts into the cavity, rather than to etch it at the bottom of an already formed cavity. It is suggested this approach is advantageous over the above-described method of FIG. 1 because it is easier to form fine features such as posts (or holes) on a planar surface without a cavity. However, this fabrication method involves excessive wastage of material and inherently requires a relatively thick silicon wafer in which to form a deep cavity of approximately 100 µm after forming the field of posts. Furthermore, forming a deep cavity in the silicon wafer requires a relatively long etching time to remove material and it has been found that this longer etching time results in distorted moth-eye structures, depicted in a simplified form in FIG. 3a and shown in detail in the SEM image of FIG. 3b.

It is an object of the present invention to provide an improved cover for an IR detector and a method of manufacturing the same.

SUMMARY OF THE INVENTION

According to the present invention, there is provided a method of fabricating a cover for an infrared detector comprising the steps of:
  providing a first wafer comprising a material that transmits infrared radiation and having a first surface and a second surface opposite the first surface;
  masking the first surface with a pattern defining a first plurality of antireflective elements;
  etching the first surface to form the first plurality of antireflective elements, the pattern chosen such that the first plurality of antireflective elements form a region of graded refractive index that reduces the amount of infrared radiation reflected at the first surface;
  the first plurality of antireflective elements forming an antireflective region of the wafer;
  depositing a dielectric layer of material on the first surface to cover the first plurality of antireflective elements;
  depositing one or more additional layers of material on the dielectric layer;
  masking a region of the uppermost layer that surrounds the first plurality of antireflective elements;
  etching each layer to expose the first plurality of antireflective elements; and
  removing the mask surrounding the first plurality of antireflective elements to expose the remaining layers of material on the first surface, the remaining layers of material defining a wall surrounding the first plurality of antireflective elements.

Advantageously, a cover fabricated according to the first aspect allows for a uniform grating of antireflective elements to be formed in a surface of a silicon wafer at the base of a deep cavity defined by the wall without the need to remove a large portion of wafer material in forming the cavity. Furthermore, since the cavity is defined by a wall that is built up of deposited layers of material rather than from the removal of wafer material, the dimensions of the cavity can be finely adjusted with greater precision.

The method may further comprise the steps of masking the second surface with a pattern defining a second plurality of antireflective elements; and etching the second surface to form the second plurality of antireflective elements, the pattern chosen such that the second plurality of antireflective elements form a region of graded refractive index that reduces the amount of infrared radiation reflected at the second surface, the first plurality of antireflective elements and the second plurality of antireflective elements together forming the antireflective region of the wafer.

The method may further comprise the steps of masking the first surface with a shape defining a first depression, and etching the first surface to form the first depression in the first surface, the first depression having a base below the rest of the first surface. The steps of masking the first surface with a pattern defining a first plurality of antireflective elements and etching the first surface to form the first plurality of antireflective elements may be performed on the base of the first depression.

The method may further comprise the steps of masking the second surface with a shape defining a second depression; and etching the second surface to form the second depression in the second surface, the second depression having a base below the rest of the second surface.

The steps of masking the second surface with a pattern defining a second plurality of antireflective elements and etching the second surface to form the second plurality of antireflective elements may be performed on the base of the second depression.

The steps of masking and etching the first and/or second depressions may be performed before the steps of forming the first and/or second plurality of antireflective elements.

The step of etching the dielectric layer may be performed by wet etching. The dielectric layer and at least two additional layers of material may be deposited on the first surface, and one of the at least two additional layers may be a barrier layer.

The layers may be applied such that the combined thickness of the layers is between approximately 5 µm and 100 µm. Each plurality of antireflective elements may be formed in a quadratic pattern or a trigonal pattern.

The method may further comprise the step of bonding one or more additional wafers to the first wafer in a stacked arrangement, wherein the one or more additional wafers each comprise a wall formed from a plurality of deposited layers of material, the one or more additional wafers bonded to an adjacent wafer via the corresponding wall, wherein the one or more additional wafers comprises an antireflective region of antireflective elements, a meta lens, or a Fresnel lens.

The method may further comprise the step of bonding the wall of the cover to a substrate including a sensor array such that the antireflective region is positioned relative to the sensor array so that, in use, infrared radiation passing through the antireflective region is incident on the sensor array.

According to a second aspect of the present invention, there is provided a cover for an infrared detector comprising:
  a wafer comprising a material that transmits infrared radiation and having a first surface and a second surface opposite the first surface;
  an antireflective region formed in the wafer to enhance transmission of infrared radiation through the cover;
  wherein the antireflective region comprises a first plurality of antireflective elements formed in the first surface, the first plurality of antireflective elements sized and shaped and arranged relative to one another to form a region of graded refractive index at the first surface so as to reduce the amount of infrared radiation reflected by the cover at the antireflective region;
    wherein the cover comprises a wall extending from the first surface and surrounding the antireflective region; and
  wherein the wall comprises a plurality of layers of material deposited on the wafer.

The antireflective region may further comprise a second plurality of antireflective elements formed in the second surface, the second plurality of antireflective elements sized and shaped and arranged relative to one another to form a region of graded refractive index at the second surface.

The first plurality of antireflective elements formed in the first surface may be formed in the base of a first depression of the first surface and the second plurality of antireflective elements formed in the second surface may be formed in the base of a second depression of the second surface.

The first depression and the second depression may be approximately 3 µm deep. One layer of the plurality of layers of material may comprise an oxide layer, and one layer of the plurality of layers may comprise a metallic bonding layer for bonding the cover to a sensor substrate.

The combined thickness of the plurality of layers of material may be between approximately 5 µm and 100 µm. Each plurality of antireflective elements may be formed in a quadratic pattern or a trigonal pattern.

According to a third aspect of the present invention, there is provided an infrared detector comprising a substrate including an infrared sensor and a cover according to the second aspect bonded to the substrate so as to encapsulate the infrared sensor, wherein the antireflective region of the cover is arranged in relation to the infrared sensor such that, in use, infrared radiation transmitted through the antireflective region is incident upon the infrared sensor.

The cover may be bonded to the substrate via the wall of the cover such that the substrate, wall, and lower surface together define a cavity, and wherein the depth of the cavity is defined by the thickness of the layers of material of the wall.

DESCRIPTION OF THE DRAWINGS

In order that the invention may be more clearly understood, embodiments thereof will now be described, by way of example, with reference to the accompanying drawings in which.

DETAILED DESCRIPTION

Figure 1:
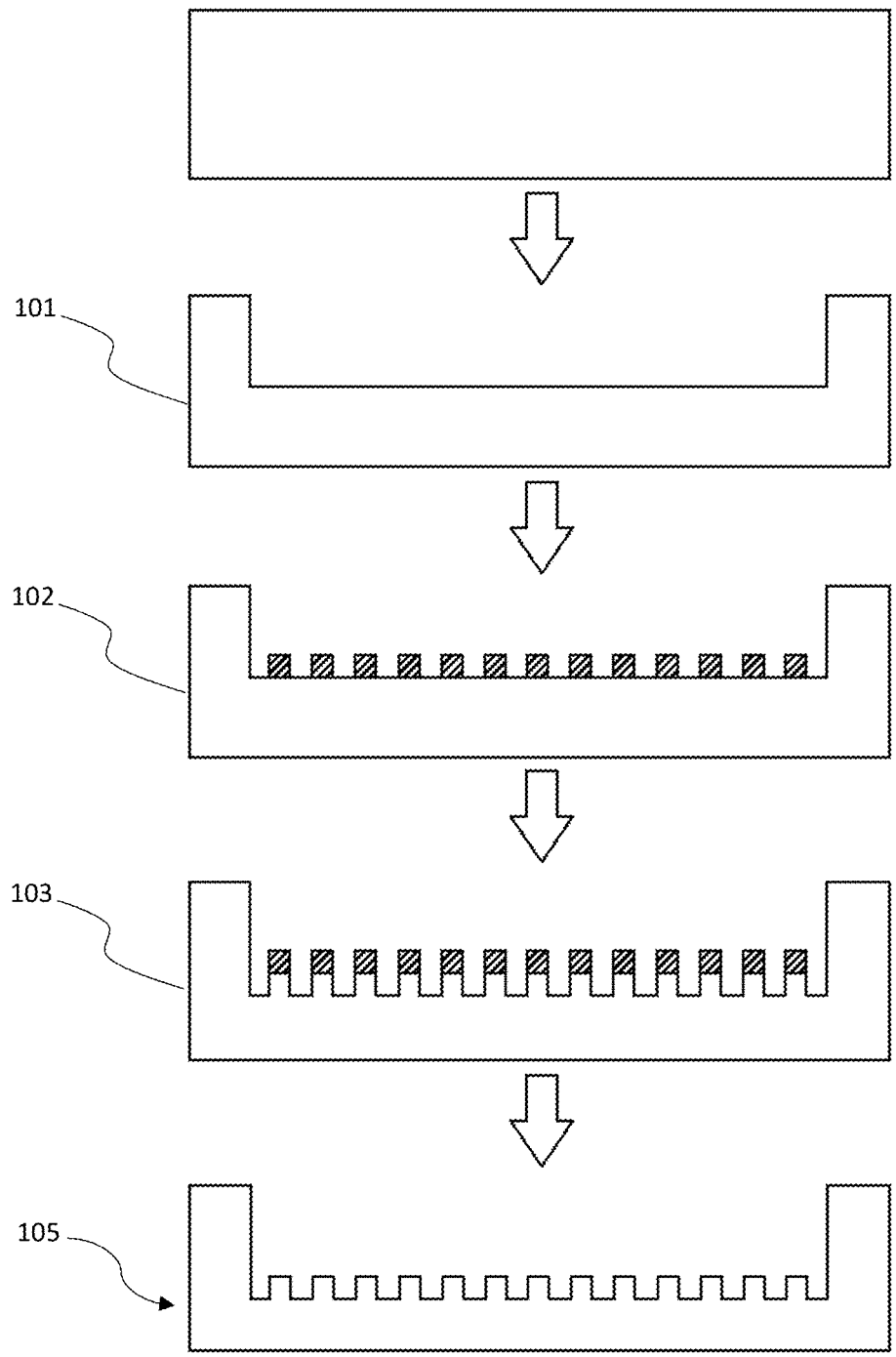
FIG. 1 shows a simplified representation of the steps in forming a desired plurality of antireflective elements at the base of a cavity already formed in a surface of a silicon wafer intended to be used as a cover for an infrared detector.
Figure 2:
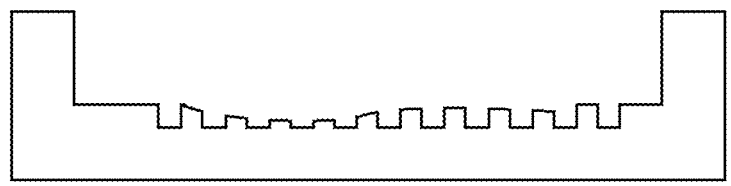
FIG. 2 shows a simplified representation of the plurality of antireflective elements expected to be formed in practice by the steps of FIG. 1.
Figure 3A:
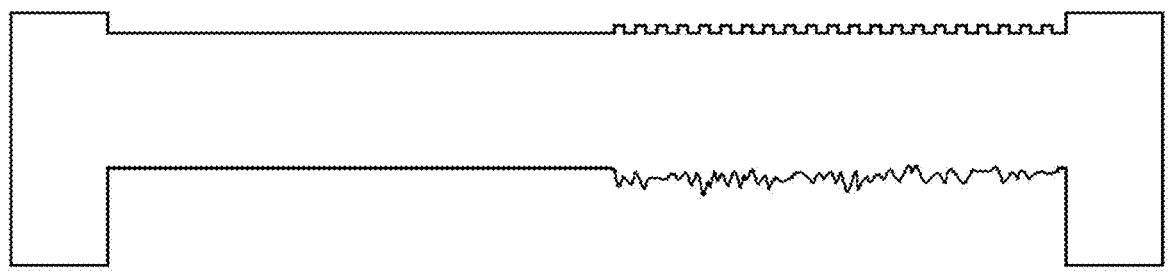
FIG. 3a shows a simplified representation of a plurality of antireflective elements formed on two sides of a silicon wafer, with one set of antireflective elements being formed in a deep cavity after an etching procedure according to the teachings of U.S. Pat. No. 6,838,306 B2 and with sub-optimal results.
Figure 3B:
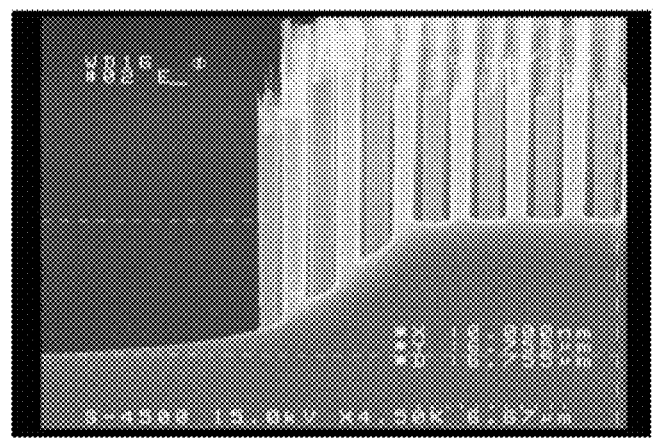
FIG. 3b shows a scanning electron microscope image of a plurality of antireflective elements formed in the surface of a silicon wafer according to the teachings of U.S. Pat. No. 6,838,306.
Figure 4:
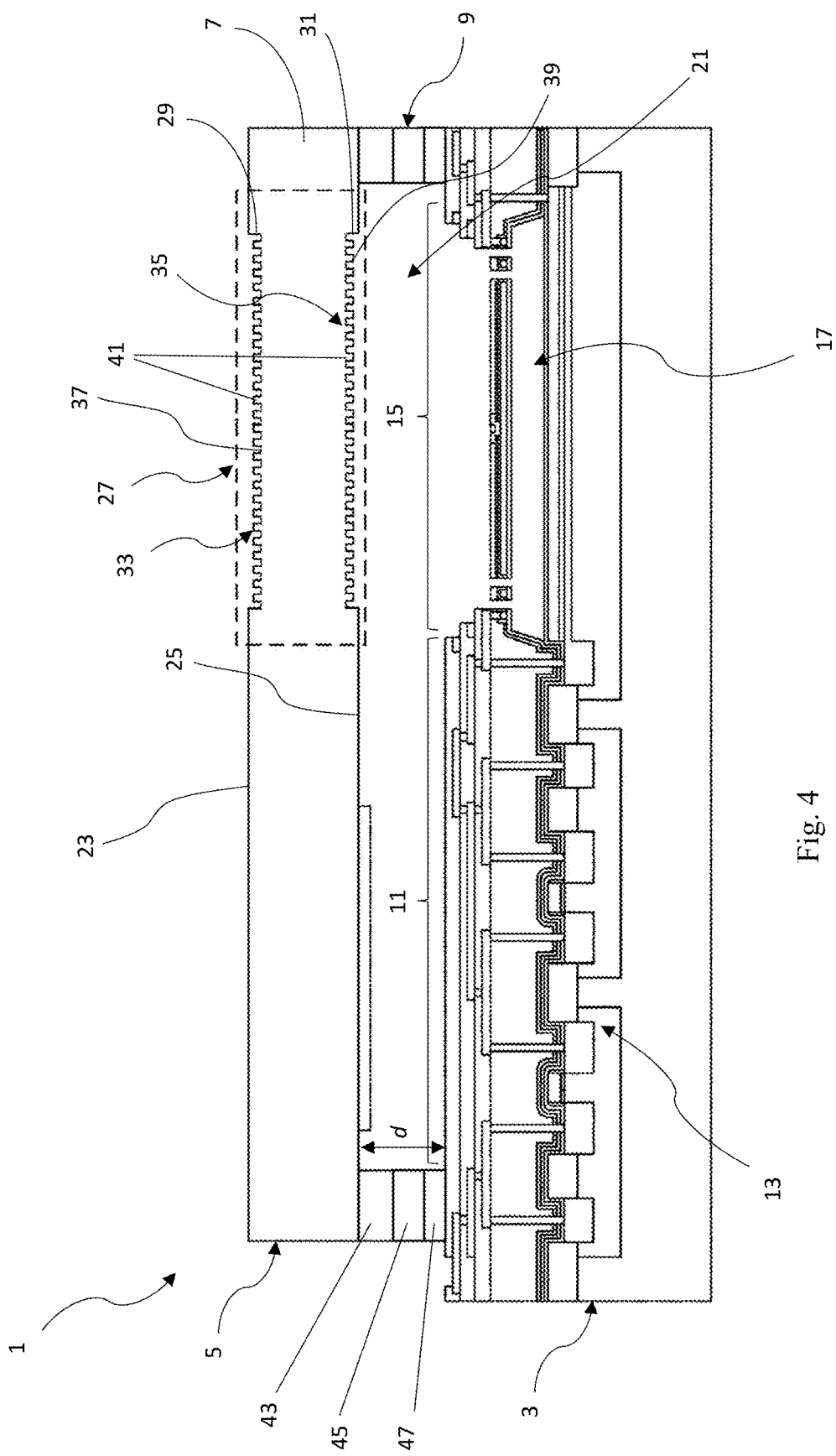
FIG. 4 shows a cross-section of an infrared detector according to one aspect of the present invention comprising a cover fabricated according to a fabrication method of the present invention.

Referring to FIG. 4, there is shown an infrared (IR) thermo-sensor 1 comprising a sensor wafer 3 and a cover 5 bonded to the sensor wafer 3, the cover 5 comprising a cap wafer 7 and a sidewall 9. The sensor wafer 3 comprises a silicon (Si) substrate with a CMOS region 11 comprising CMOS components 13 and a sensor region 15 comprising a MEMS structure 17 such as a thermoelectric sensor for the detection of infrared radiation.

The cover 5 is bonded to the sensor wafer 3 via the sidewall 9 to define a hermetically sealed cavity 21 which contains the sensor region 15 and reduces the risk of the MEMS components 17 becoming damaged or contaminated by the external environment. A vacuum environment is present within the cavity 21 to reduce irradiation and enhance the precision and sensitivity of the IR thermo-sensor 1. The depth, d, of the cavity 21 is determined by the height of the sidewall 9 which may be adjusted during the fabrication of the cover 5 by adjusting the thickness of the layers applied in constructing the sidewall 9 (discussed further below).

The cap wafer 7 of the cover 5 comprises a thin, substantially flat Si substrate with upper and lower surfaces 23, 25 (upper and lower graphs). The Si substrate is IR transparent so that infrared radiation emitted by a warm body, such as a human body, can pass through the cover 5 and fall on the sensor region 15 for detection purposes. An antireflective region 27 is formed in the cap wafer 7 to reduce the amount of IR reflected at the upper and lower surfaces 23, 25 and thereby improve the IR transmittance of the cover 5. The antireflective region 27 comprises a shallow cavity 29, 31 approximately 3 µm deep formed in both the upper and lower surfaces 23, 25 of the cap wafer 7 on opposite sides, respectively. A plurality of antireflective elements or "moth-eye" structures 33, 35 is formed in a base surface 37, 39 of each shallow cavity 29, 31, thereby forming a region of graded refractive index that reduces the amount of IR reflected at the upper and lower surfaces 23, 25 of the antireflective region 27.

Figure 5:
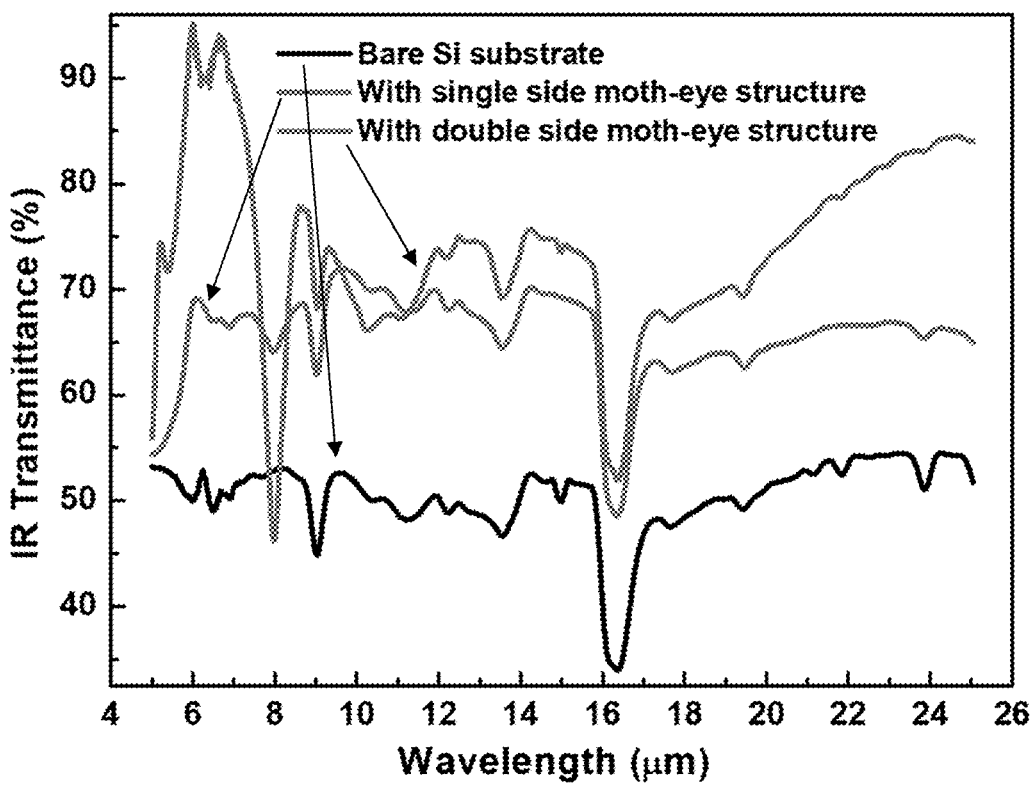
FIG. 5 shows a chart comparing the percentage transmittance of infrared radiation across a range of wavelengths for a bare Si substrate, a Si substrate comprising moth-eye structures formed in one side, and a Si substrate comprising moth-eye structures formed in both sides of the substrate.
Figure 6:
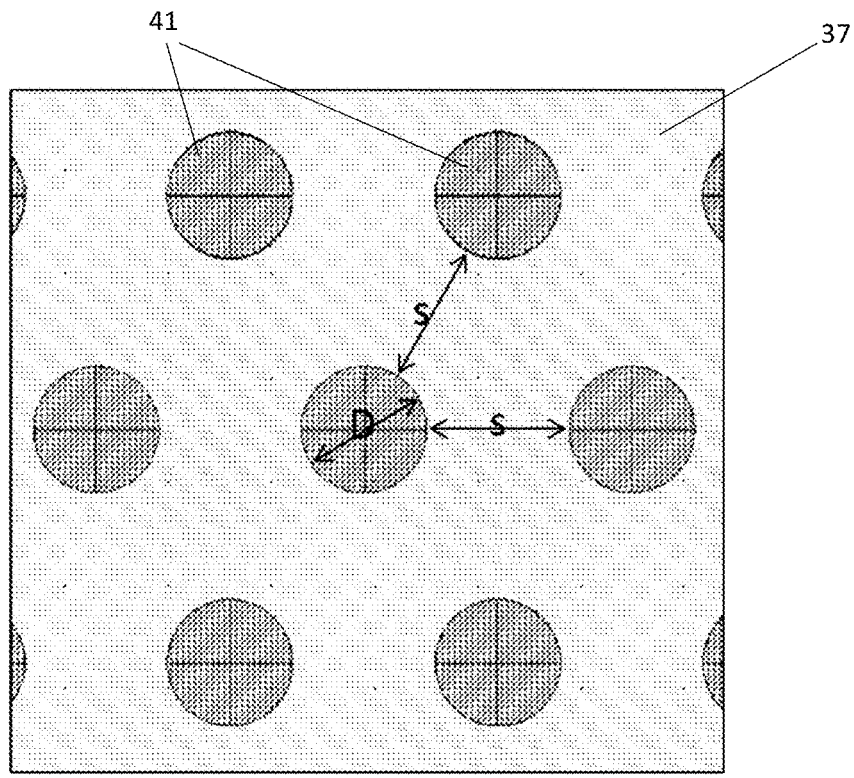
FIG. 6 is an enlarged simplified plan view of a plurality of antireflective elements including labelling for the diameter of an antireflective element and the spacing between two adjacent antireflective elements.
Figure 7:
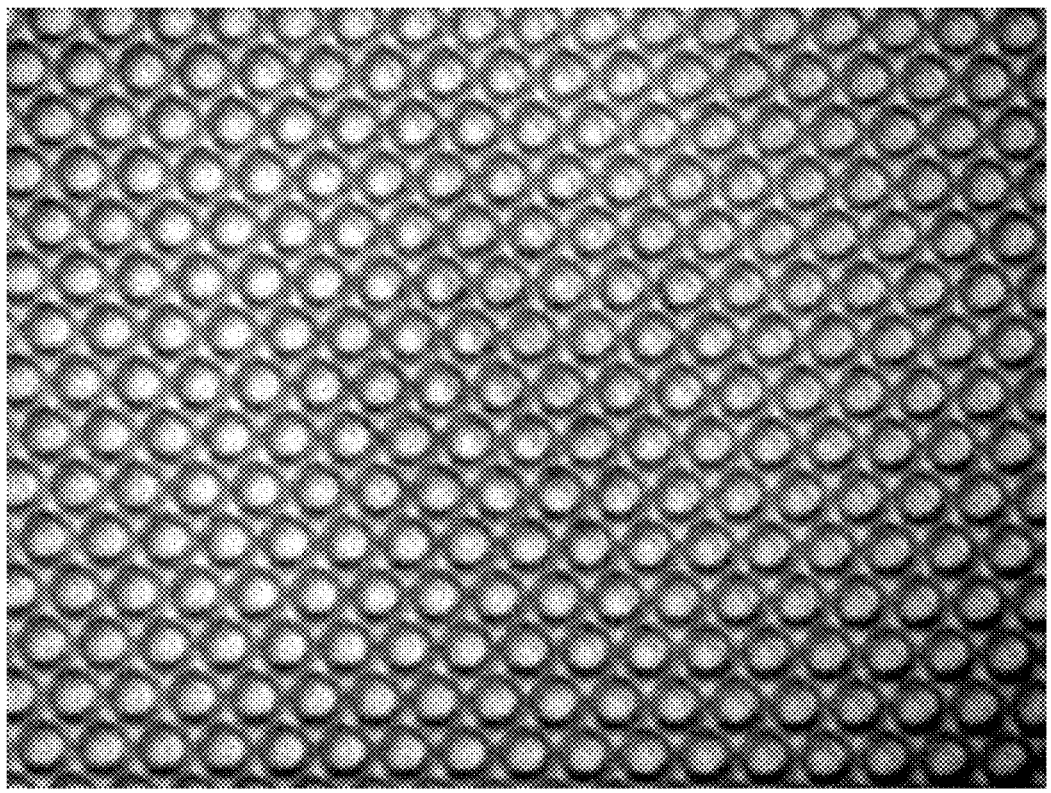
FIG. 7 is a magnified view of a plurality of antireflective elements formed in a silicon wafer surface.

Referring to FIG. 5, the effect of an antireflective region 27 on the IR transmittance of the cover 5 is depicted graphically and demonstrates that a Si substrate comprising a plurality of moth-eye structures 33, 35 on one or both sides 23, 25 of the Si substrate has a greater IR transmittance than a bare Si substrate, and that forming the moth-eye structures 33, 35 on both sides 23, 25 of the Si substrate produces the greatest level of IR transmittance. Accordingly, whilst forming the moth-eye structures on one side of the Si substrate enhances the IR transmittance, a cover 5 with a plurality of moth-eye structures 33, 35 on both sides of the antireflective region 27 is more preferred.

In the embodiment depicted, each plurality of moth-eye structures 33, 35 comprises substantially equally spaced apart cylindrical formations 41 extending from the base surface 37, 39 of the respective shallow cavities 29, 31 in a quadratic pattern. The diameter and relative spacing of the moth-eye structures 41 is chosen according to the desired IR transmittance of the cover 5 and the range of wavelengths of infrared radiation intended to be detected by the IR thermo-sensor 1. The IR thermo-sensor 1 of the present embodiment is intended to detect thermal radiation of the human body, which typically emits infrared radiation in the wavelength range 8 µm to 151 µm. Accordingly, the moth-eye structures 41 of the cover 5 are sized and spaced to preferentially transmit infrared radiation in the wavelength range 8 µm to 151 µm, and most preferably for wavelengths of around 10 µm.

In determining the appropriate dimensions of the moth-eye structures 41 for a desired wavelength detection range, it is noted that the IR transmittance through the cap wafer 7 is the transmittance product of the upper and lower surfaces 23, 25, plus the amount of IR absorbed by the substrate. For infrared radiation sensing in the desired wavelength range of 8 µm to 151 µm, Fresnel reflection occurring at the surface of a silicon wafer leads to a loss of approximately 30% at each surface. Incident beams reflected from the upper and lower surfaces 23, 25 results in total reflection losses of approximately 49%. Losses due to absorption of infrared radiation by the silicon cap wafer 7 also have to be considered. The moth-eye structures patterned on the surfaces of the silicon cap wafer 7 are effective in reducing Fresnel reflection due to increased scattering of incident beams inside the moth-eye structures 41 which increases the percentage of infrared radiation absorbed by the silicon wafer cap 7. The effective medium theory provides insight on the chosen design of the moth-eye pattern, and states that the largest grating period $\Lambda_{max}$ for a quadratic arrangement of grating cells should be smaller than the shortest wavelength of incident electromagnetic radiation to be detected $\lambda_{min}$:

$$\Lambda_{max} < \frac{\lambda_{min}}{n}$$

Where n is the refractive index of silicon.

Accordingly, with a lower wavelength of the desired detection range of 8 µm and a refractive index of silicon of 3.42, a maximum grating period for a quadratic arrangement of moth-eye structures 41, $\Lambda_{max}$, is determined to be:

$$\Lambda_{max} = \frac{8}{3.42} = 2.34 \ \mu m$$

U.S. Pat. No. 6,838,306 teaches that the fill factor of the moth-eye structures 41 across the area of the base 37, 39 of a shallow cavity 29, 31 may be determined according to:

$$A = \left(\frac{\pi}{4}\right)\left(\frac{d}{s}\right)^2$$

where d is the diameter of a moth-eye structure 41 and s is the centre-to-centre spacing between adjacent moth-eye structures 41. Using the fill factor, a desired effective index may be determined using the formula:

$$n = \left(\frac{[1 - A + An_w^2][A + (1 - A)n_w^2] + n_w^2}{2[A + (1 - A)n_w^2]}\right)^{1/2}$$

Where $n_w$ is the refractive index of the silicon wafer.

In the present embodiment, with a view to enhancing IR transmittance in the wavelength range 8 µm to 151 µm, the moth-eye structures 41 may be chosen to have a diameter of between 1.5 µm and 2.5 µm and relative spacing of between 0.4 µm and 0.6 µm. The height of the moth-eye structures 41 may be varied by adjusting the etching depth to achieve different levels of IR transmittance through the antireflective region 27 of the cover 5 for given diameter and spacing parameters. In the present embodiment, the moth-eye structures are preferably formed with a height of between 0.8 μm and 1.2 μm.

Figure 8:
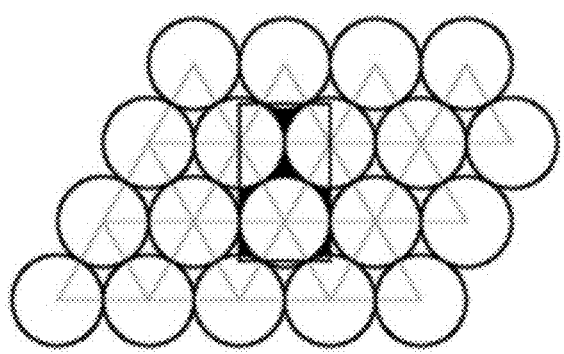
FIG. 8 shows a comparison between a trigonal pattern of moth-eye structures and a quadratic pattern of moth-eye structures.
Figure 8:
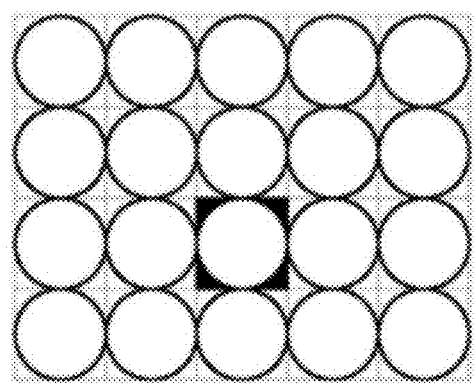

Whilst a quadratic pattern of moth-eye structures may be used to enhance IR transmittance, it has also been determined that moth-eye structures arranged in a trigonal pattern (shown for comparison in FIG. 8) can be at least as effective in enhancing the IR transmission through the cap wafer 7. In addition, whilst the above-described embodiment is configured to preferentially detect infrared radiation in the wavelength range 8 μm to 151 μm, it will be appreciated that the properties of the sensor wafer 3 and cover 5 may be adjusted to preferentially detect infrared radiation in higher or lower wavelengths depending on the choice of application. For example, the size and spacing of the moth-eye structures 41 may be adjusted to preferentially transmit IR radiation in the wavelength range 0.75 μm to 1.4 μm for NIR applications such as remote sensing and fibreoptic communications or up to the wavelength range 15 μm to 1000 μm for FIR applications such as in laser fusion diagnostics.

Although cylindrically shaped structures are chosen in the present embodiment, it will also be apparent to a person skilled in the art that other shapes may be chosen whilst still achieving antireflective properties by creating a region of graded refractive index at the silicon wafer surface. For example, the moth-eye structures may be fabricated to have a square or rectangular cross-section or may have a variable cross-section such as that of a frustum.

Since the moth-eye structures 41 in the embodiment of FIG. 4 are formed in the base surface 37, 39 of the shallow cavities 29, 31, the moth-eye structure 41 sit below the surface 23, 25 in which the shallow cavity 29, 31 is formed. Accordingly, the risk of the delicate moth-eye structures 41 being damaged due to friction during fabrication is reduced due to the protection afforded by the surfaces 23, 25 in which the shallow cavities 29, 31 are formed. It will be appreciated that the moth-eye structures 41 may be alternatively formed directly in the upper and/or lower surfaces 23, 25 of the cap wafer 7 without first forming the shallow cavities 29, 31 but that this increases the risk of damage to the moth-eye structures 41 and the formation of an antireflective region 27 with sub-optimal performance.

As described above, the depth, d, of the cavity 21 is determined by the thickness of the sidewall 9 comprising multiple layers of material deposited on the lower surface of the cap wafer 7 during fabrication. The chosen cavity depth is affected by the bonding wafer conditions during fabrication and the vacuum requirement of the IR thermo-sensor 1. A deeper cavity is generally preferred for a higher, more long-standing vacuum because it helps to minimise degradation of the vacuum due to the diffusion of residues on the walls into the cavity 21. In the present embodiment, the sidewall 9 comprises three layers 43, 45, 47; a first layer 43 of $SiO_2$ forming a dielectric layer of approximately 1 μm in thickness applied directly to the lower surface 25 of the cap wafer 7, a second, relatively thicker layer 45 applied over the first layer 43 to form a barrier layer, and a third bonding layer 47 of between approximately 0.5 μm to 5 μm in thickness comprising a metal or metal alloy such as aluminium, copper or tin which is suitable for bonding the sidewall 9 of the cover 5 to the sensor wafer 3.

The combined thickness of the three layers 43, 45, 47 and, hence, depth of the cavity 21 may be chosen to be between 5 μm and 100 μm depending on the intended IR sensor use case and desired vacuum environment within the cavity 21. The bulk of the sidewall 9 is made from the intermediate barrier layer 45 and may therefore be chosen to be between approximately 3.5 μm and 98.5 μm in thickness depending on the desired cavity depth and the chosen thicknesses of the first and third layers 43, 47. The sidewall 9 may comprise one or more additional layers arranged between the dielectric layer 43 and the barrier layer 45 such as a film of polysilicon or amorphous silicon. The sidewall 9 is formed on the lower surface 25 so as to surround the shallow cavity 31 and plurality of moth-eye structures 35 of the lower surface 25 and thereby define a cavity 21 that encapsulates the sensor region 15 of the sensor wafer 3.

Figure 9:
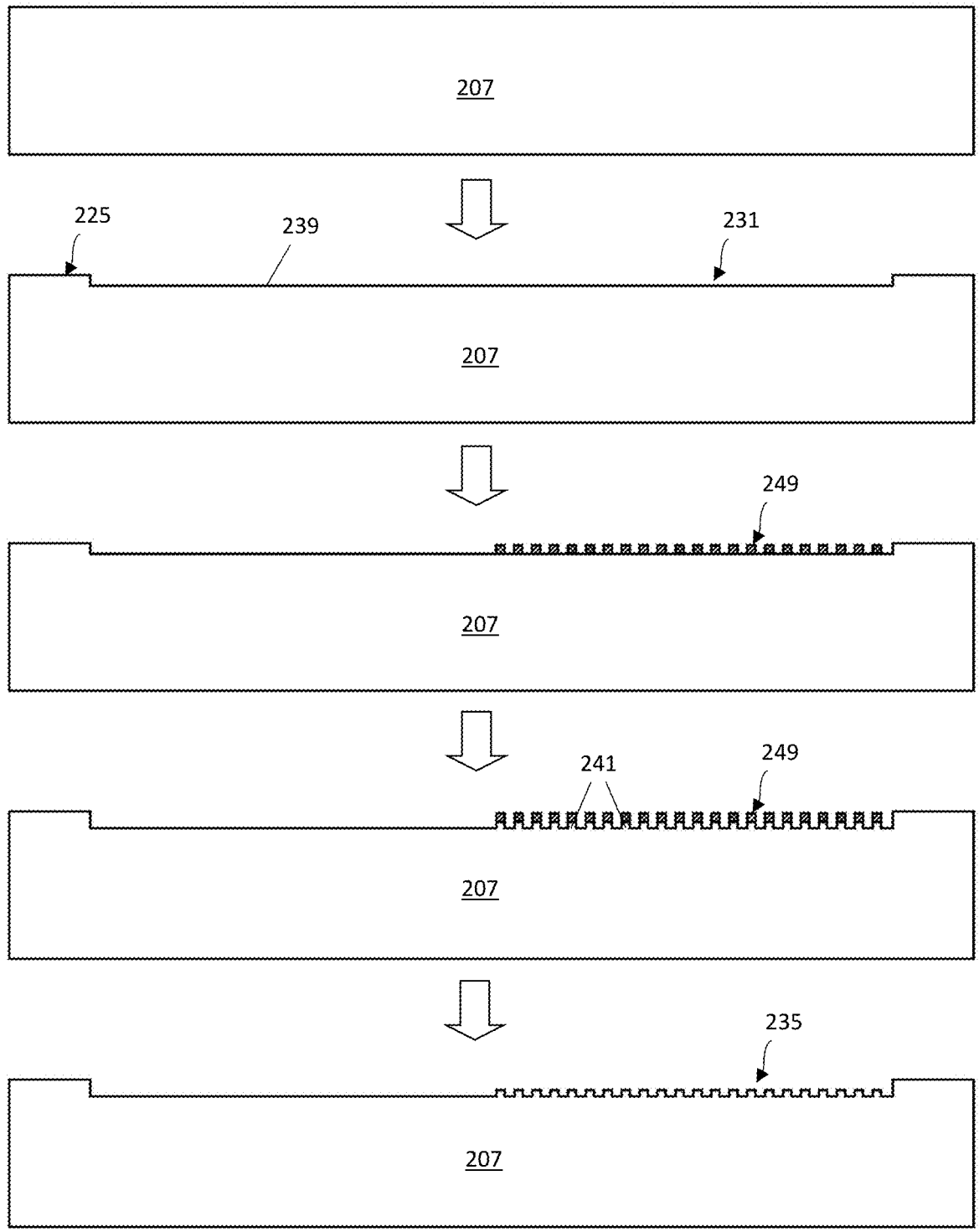
FIG. 9 shows a simplified representation of the steps of a fabrication method according to an aspect of the present invention in forming a plurality of antireflective elements in a first surface of a silicon wafer shown in cross-section and intended to form part of a cover of an infrared detector.
Figure 10:
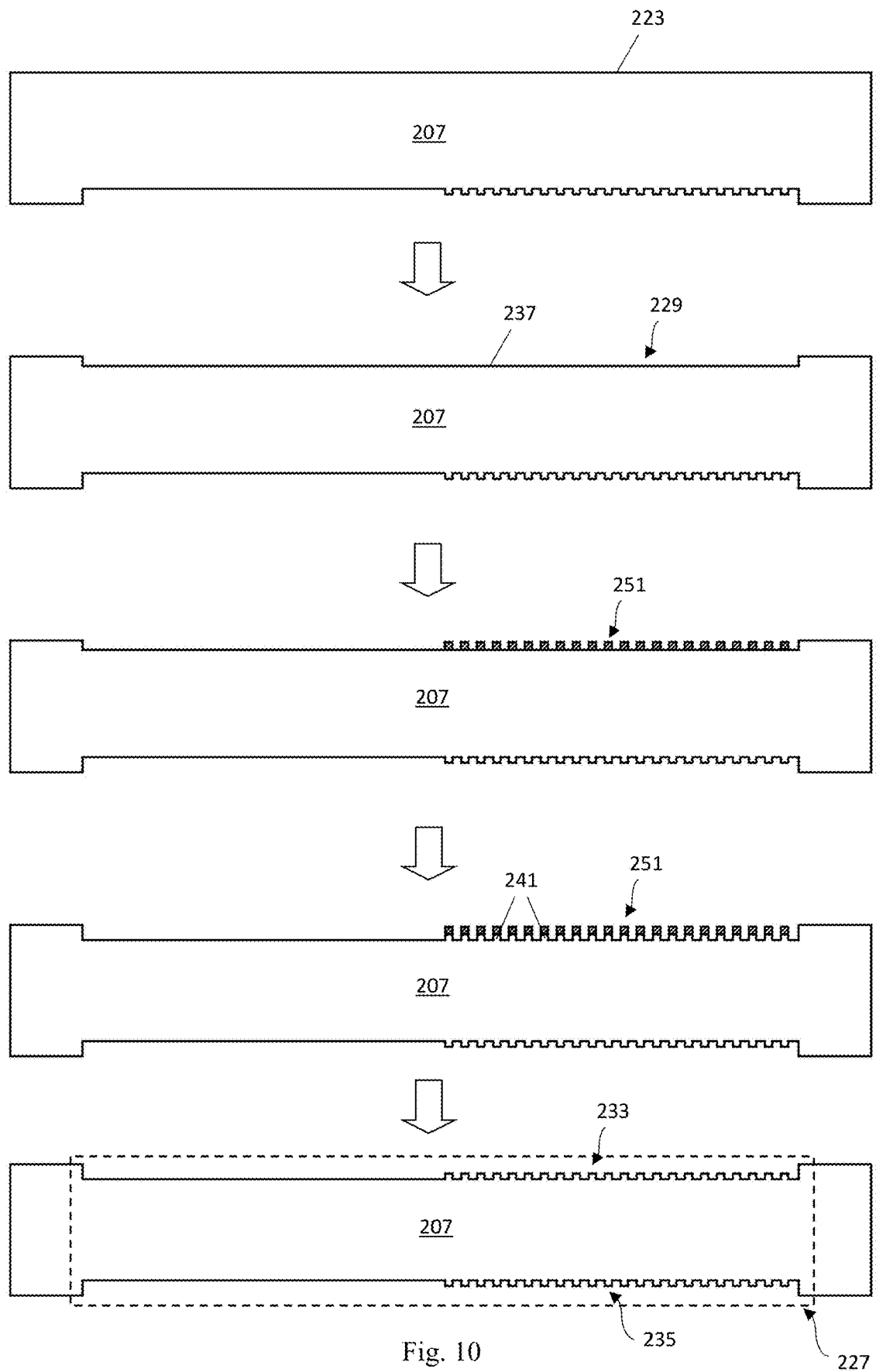
FIG. 10 shows a simplified representation of the steps of a fabrication method according to the present invention in forming a plurality of antireflective elements in a second surface of the silicon wafer shown in cross-section in FIG. 9.
Figure 11:
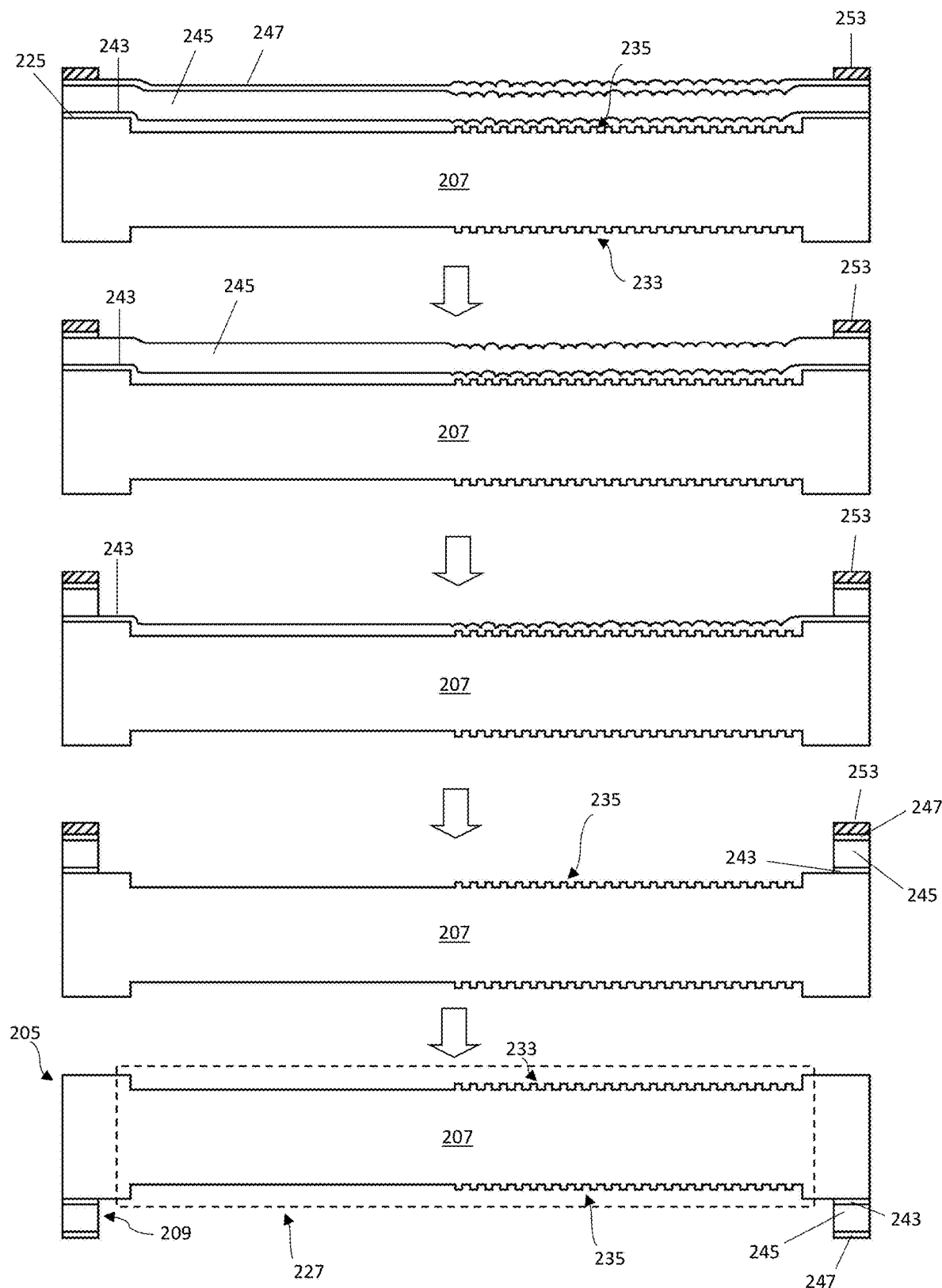
FIG. 11 shows a simplified representation of the steps of a fabrication method according to the present invention in forming a wall extending from the first surface of the silicon wafer of FIG. 9 so as to surround the region of the first surface comprising a plurality of antireflective elements.

Referring to FIGS. 9 to 11, a cover 205 is fabricated by a series of masking, etching and deposition steps performed on a cap wafer 207. As shown in FIG. 9, a first shallow cavity or depression 231 approximately 3 μm deep is formed in a first surface 225 of a silicon wafer 207 by masking a shape defining the first depression 231 with a photoresist (PR) film and then carving out a first depression 231 with a substantially flat base 239 by wet or dry etching. The size and shape of the first depression 231 is created according to the desired cross section of the antireflective region 227 of the cover 205 and the size of the corresponding sensor region of the sensor wafer. A further PR film 249 is applied to the base 239 of the first depression 231 with a pattern defining the cross-section of a first plurality of antireflective elements or moth-eye structures 235 for a subsequent etching step. As described above, the pattern may be chosen to define moth-eye structures with diameters of between 1.5 μm and 2.5 μm and relative spacing of between 0.4 μm and 0.6 μm.

By keeping the depth of the first depression 231 relatively shallow at 3 μm a smooth PR film 249 is achieved which helps to ensure a uniform array of moth-eye structures 241 is formed in the base of the first depression 231 upon etching. The etching step timings are chosen to remove enough material from the cap wafer 207 such that the moth-eye structures 241 are formed in the first depression 231 with a height of between 0.8 μm and 1.2 μm. Preferably, all the moth-eye structures 241 should be of the same approximate height so that a relatively uniform grating pattern is achieved. It will be appreciated that the moth-eye structures 241 may be formed in the first surface 225 of the cap wafer 207 without first etching a depression 231 but as described above, this may increase the risk of the delicate moth-eye structures 241 being damaged during subsequent fabrication steps.

Turning to FIG. 10, with the first plurality of moth-eye structures 235 formed in the first surface 225, the cap wafer 207 is flipped to expose the second surface 223 so that a second plurality of moth-eye structures 233 may be formed therein. As with the steps involved in forming the first plurality of moth-eye structures 235, a second depression 229 is defined by a PR film in a position of the second surface 223 substantially opposite the first depression 225. A second depression 229 approximately 3 μm deep with a substantially flat base 237 is then carved out by dry or wet etching to form a protective enclosure in which to form a second plurality of moth-eye structures 233. A PR film 251 is then applied to the base 237 of the second depression 223 with a pattern defining the cross-section of the desired second plurality of moth-eye structures 233 with diameters and spacing approximately equivalent to those of the first plurality of moth-eye structures 235. The second plurality of moth-eye structures 233 with a height of between approximately 0.8 μm and 1.2 μm is then formed by etching to remove material from the base 237 of the second depression and thereby form a double-sided antireflective region 227 of moth-eye structures 241.

Referring to the steps depicted in FIG. 11, with the antireflective region 227 formed, a series of layers of material 243, 245, 247 is deposited on the first surface 225 with a combined thickness equivalent to the desired depth of the cover cavity. A first layer 243 of $SiO_2$ is applied with a thickness of approximately 1 μm directly to the first surface 225 so as to cover the first plurality of moth-eye structures 235 and thereby form a dielectric layer 243 extending over the first surface 225. A second barrier layer 245 of amorphous silicon (a-Si), polycrystalline silicon (poly-Si), oxide, or other similar material used in wafer manufacture of between approximately 3.5 μm and 98.5 μm in thickness depending on the desired cavity depth is subsequently deposited on the dielectric layer 243 to prevent leakage during operation. A bonding layer 247 of gold, aluminium, copper, tin, or any other metal or metal alloy suitable for bonding purposes is then applied to the barrier layer 245 with a thickness of between approximately 0.5 μm to 5 μm.

Finally, a PR mask 253 approximately 3 μm thick is coated on the bonding layer 247 at a region of the bonding layer 247 surrounding the antireflective region 227. The shape and position of the PR mask 253 is chosen to correspond to the desired cross section and position of the sidewall 209 of the cover 205. A series of etching steps is subsequently performed on each of the layers 243, 245, 247 in series until the first plurality of moth-eye structures 235 is finally exposed. A dry or wet etching technique may be used to remove the upper two layers 245, 247 but a wet etching procedure using an appropriate acid such as a HF solution is used on the final oxide layer 243 for greater precision and preservation of the shape of the moth-eye structures. When the first plurality of moth-eye structures 235 is finally exposed, the PR mask 253 is removed to reveal the layers of material 243, 245, 247 that were preserved during the etching steps, thereby forming the sidewall 209 of the cover 205.

The cover 205 is then positioned relative to a sensor substrate such that the bonding layer 247 of the sidewall 209 contacts a bonding region of the sensor substrate and surrounds the sensor region. The cover 205 is further positioned such that the antireflective region 227 of the cover 205 extends over the sensor region so that infrared radiation transmitted via the antireflective region 227 is incident on the sensor region for detection purposes. When the cover 205 is appropriately positioned relative to the sensor substrate, pressure is applied to force the cover 205 and sensor substrate tightly together and a heating step is simultaneously performed to thermally bond the cover 205 to the sensor substrate and hermetically seal the cavity from the external environment so that a vacuum can be formed within the cavity.

Figure 12:
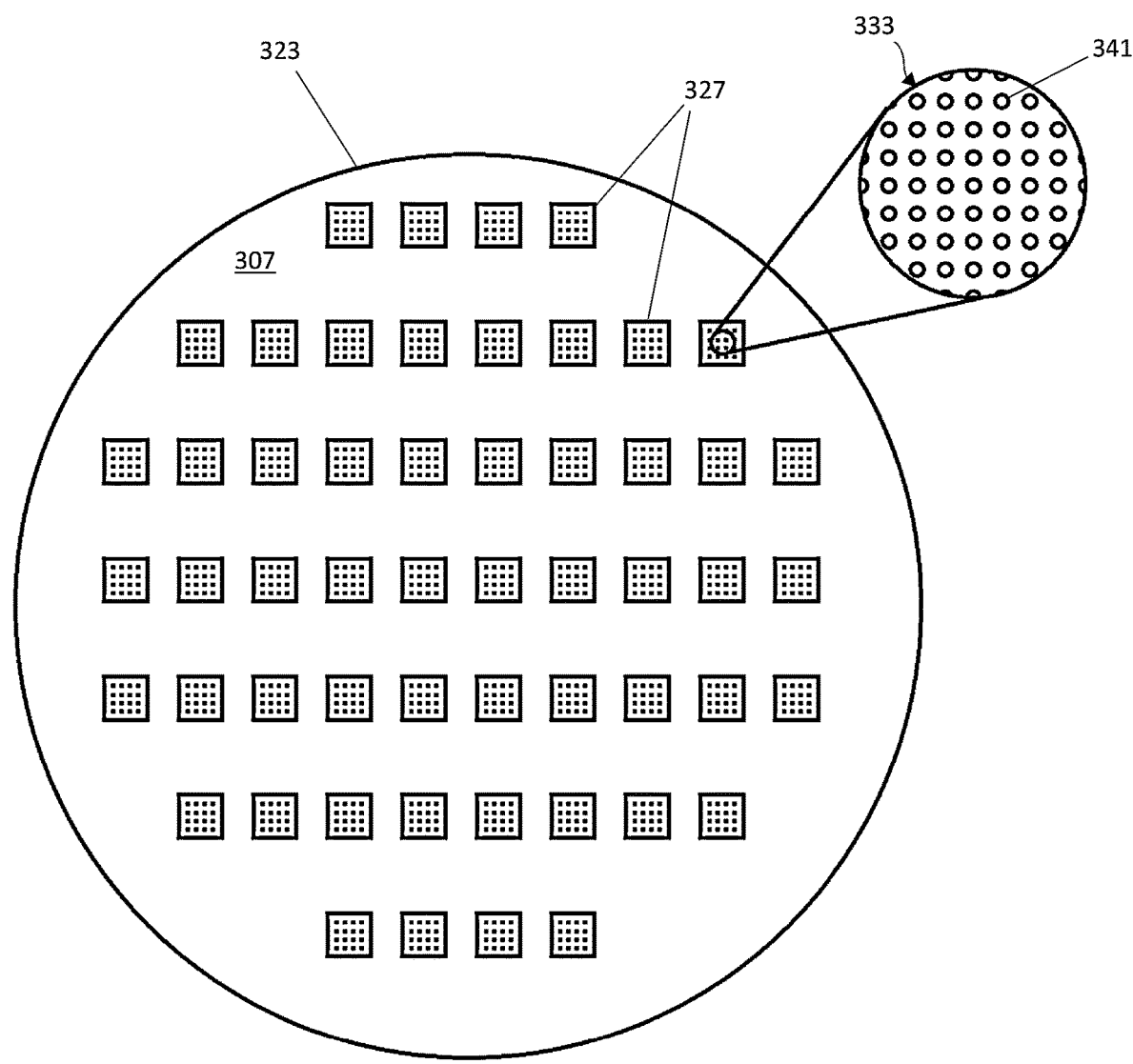
FIG. 12 shows a simplified plan view of a surface of a silicon wafer comprising a plurality of independent antireflective regions each comprising a plurality of antireflective elements (partly shown in an enlarged section) formed according to the steps shown in FIG. 9.
Figure 13:
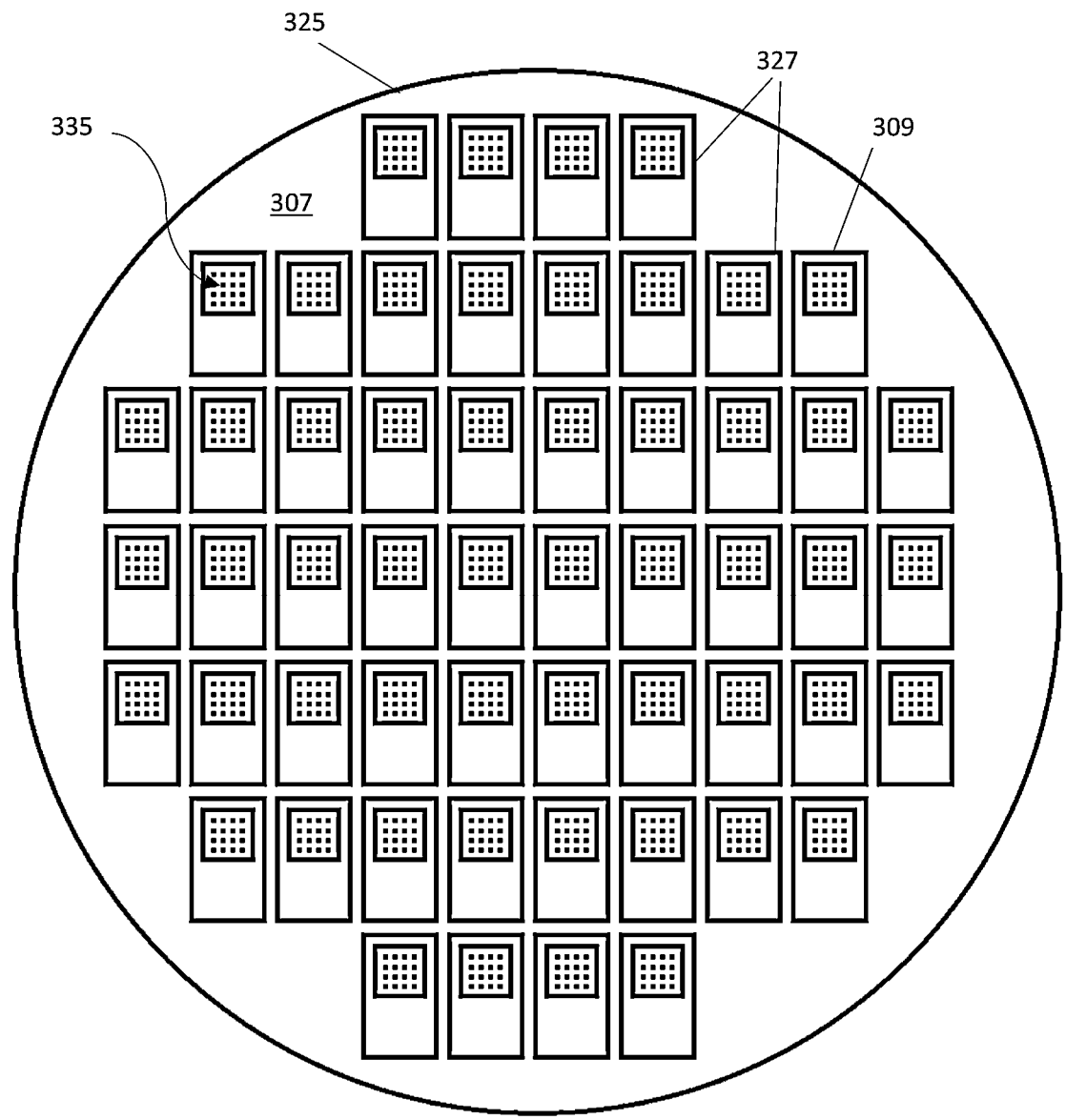
FIG. 13 shows a simplified plan view of the opposite surface of the silicon wafer shown in FIG. 12, the opposite surface comprising a plurality of independent antireflective regions each comprising a plurality of antireflective elements formed according to the steps of FIG. 10, each region surrounded by a wall formed according to the steps shown in FIG. 11.

As shown in FIGS. 12 and 13, the above-described masking and etching procedures can be carried out in parallel on a larger silicon wafer 307 to produce multiple antireflective regions 327 of moth-eye structures 341 formed, in this particular embodiment, in a quadratic pattern on both the upper graph 323 and the lower graph 325 of the silicon wafer 307. Referring specifically to FIG. 13, a sidewall 309 surrounding each antireflective region 327 may be constructed on the lower graph surface 325 using the masking and etching procedure of FIG. 11 by depositing multiple layers of material over the surface 325 of the silicon wafer 307 to achieve a desired thickness, patterning the upper layer with a PR mask to define the sidewall shape and then removing each layer by etching to expose the moth-eye structures 341 of each antireflective region 327. Upon removal of the PR mask a plurality of sidewalls 309 remain that each surround a corresponding antireflective region 327. Accordingly, it is possible to simultaneously fabricate multiple covers on a single silicon wafer 307 that may then be bonded to a corresponding sensor wafer comprising an equivalent number of sensor regions. Multiple IR sensors may then be simultaneously fabricated by arranging the cover and sensor such that each antireflective region is substantially aligned with a corresponding sensor region and then bonding the cap wafer 307 to the sensor wafer.

Figure 14:
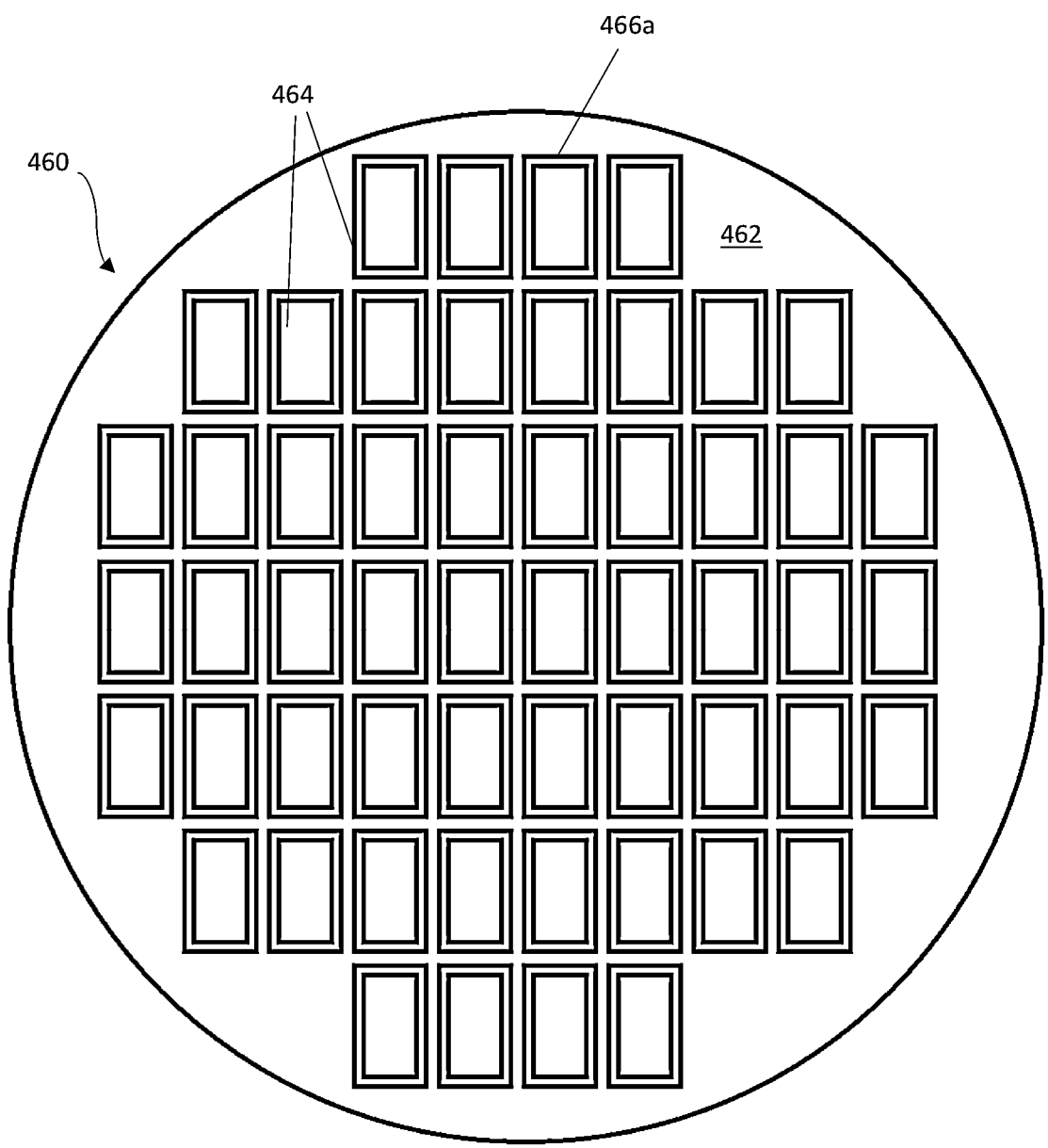
FIG. 14 shows a simplified plan view of one side of a cavity wafer layer comprising a plurality of walls each encircling a cut out formed by etching.
Figure 15:
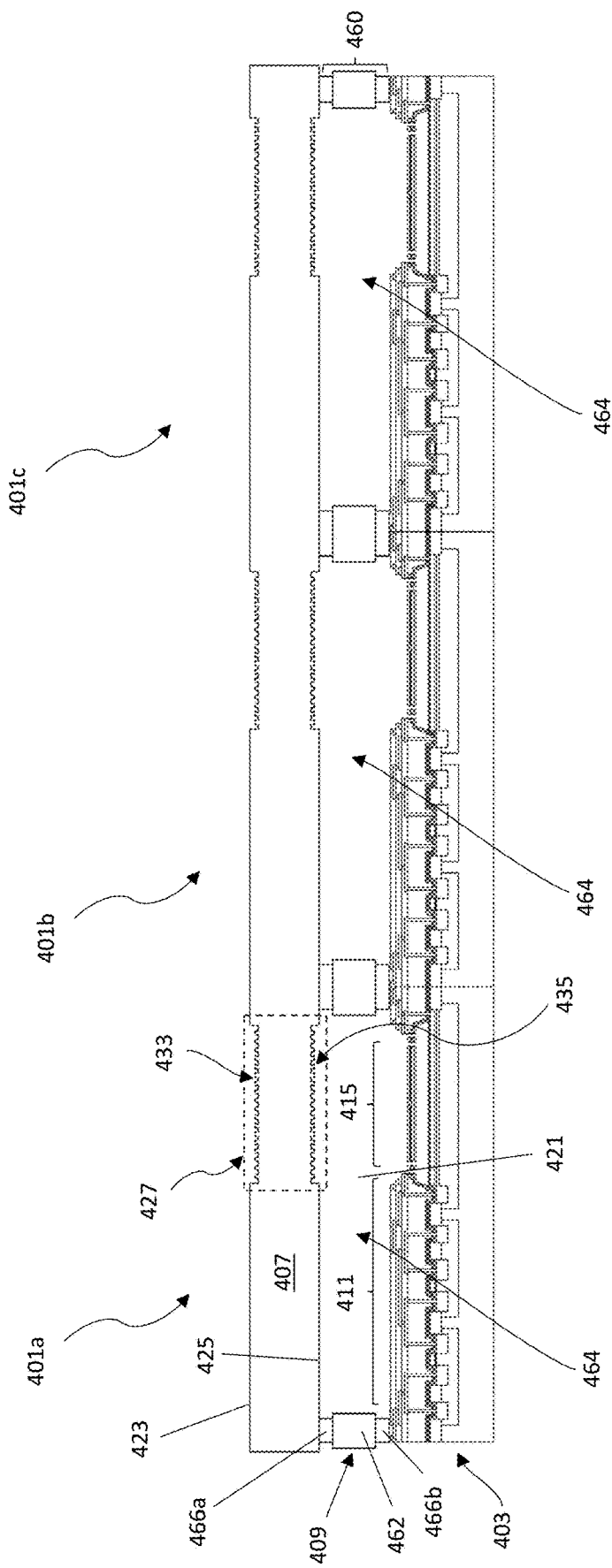
FIG. 15 shows a cross-section view of a plurality of infrared detectors formed in parallel from a sensor substrate layer, the cavity wafer layer shown in FIG. 14, and a wafer cap layer.

Referring to FIGS. 14 and 15, multiple IR thermo-sensors 401a, 401b, 401c may alternatively be fabricated from three separately formed component layers namely, a sensor wafer layer 403, a cap wafer layer 407, and an intermediate cavity wafer layer 460. As with the above-described embodiment of FIGS. 12 and 13, the cap wafer 407 comprises a plurality of antireflective regions 427 each comprising a plurality of moth-eye structures 433, 435 formed on upper and lower surfaces 423, 425 of the cap wafer 407. Likewise, the sensor wafer 403 comprises a plurality of CMOS and sensor regions 411, 415 for the detection of infrared radiation incident thereon.

The cavity wafer 460 comprises a Si substrate 462 and a plurality of apertures 464 etched through the Si substrate 462 in parallel in a grid arrangement. A pair of metallic bonding rings 466a, 466b is formed on either side of the Si substrate 462 around each aperture 464. The rings 466a, 466b are formed by first depositing a metallic layer on the upper and lower surfaces of the Si substrate 462 and then masking and etching the metallic layer with a desired pattern to reveal the bonding rings 466a, 466b. The Si substrate 462 of the cavity wafer 460 and the metallic bonding rings 466a, 466b together form the sidewall 409 of the cavity 421 of each IR thermo-sensor to be fabricated. Accordingly, the apertures 464 and associated bonding rings 466a, 466b are equivalent in number to the plurality of antireflective regions 427 formed in the cap wafer 407 and the plurality of IR sensor regions formed on the sensor wafer 403. To fabricate a plurality of IR thermo-sensors 401a, 401b, 401c the sensor wafer 403, cap wafer 407 and cavity wafer 460 are aligned such that each respective element of an individual IR thermo-sensor is positioned in a stacked arrangement, and the three layers 403, 407, 460 are bonded together. The plurality of IR thermo-sensors 401a, 401b, 401c formed within the bonded sandwich may then be diced into individual sensors for subsequent use in electronics equipment.

Figure 16:
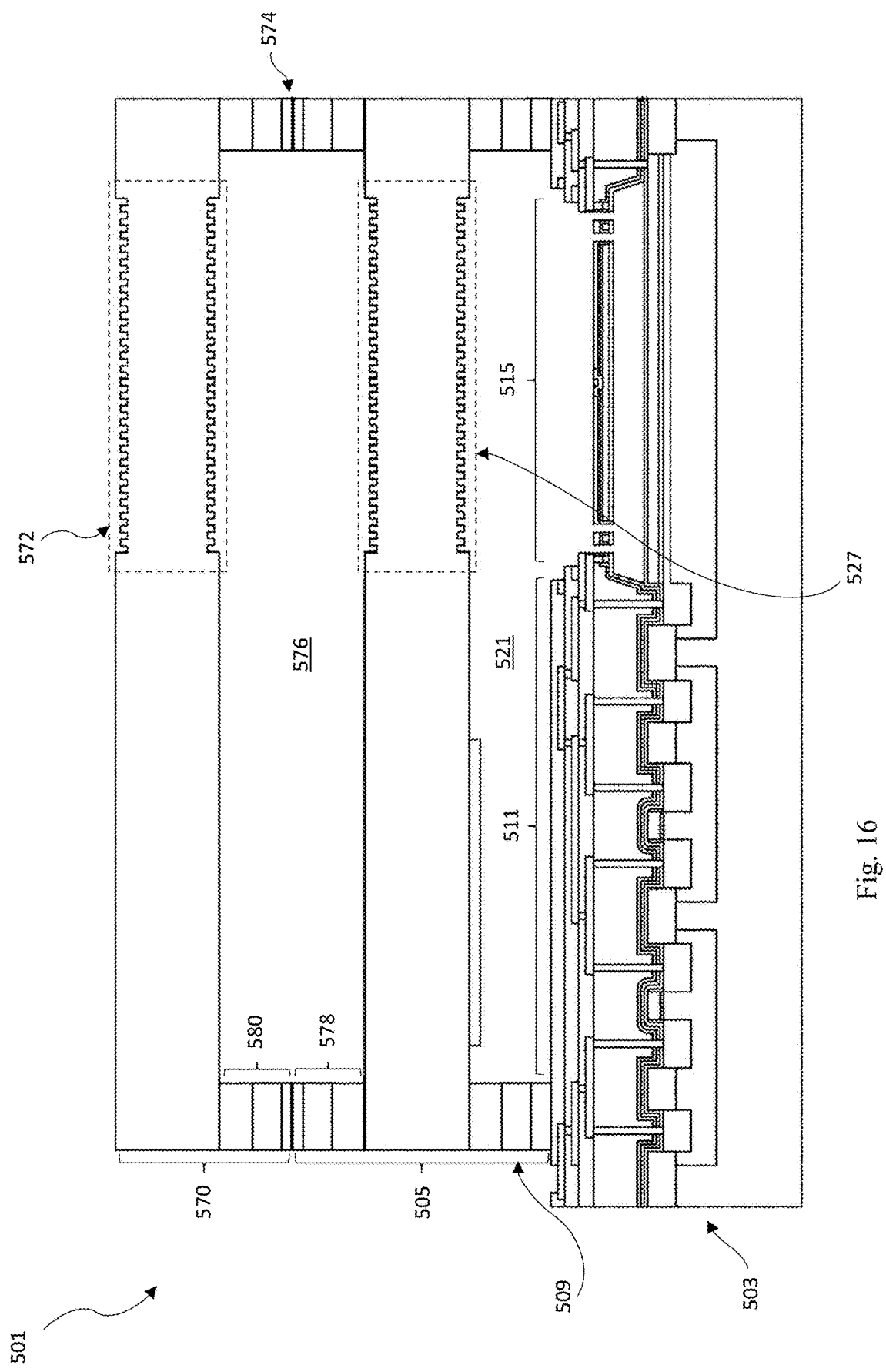
FIG. 16 shows the infrared detector of FIG. 4 with an additional wafer comprising an antireflective region of antireflective elements on the upper and lower surfaces of the additional wafer and configured to further enhance IR transmission to an IR sensor array of the sensor substrate.

The above-described fabrication techniques are also useful for stacking additional cover layers upon the sensor substrate to provide further functionalities and other characteristics that are otherwise provided by more bulky components used in conventional sensors. For example, as shown in FIG. 16, an IR thermo-sensor 501 may comprise a sensor substrate 503 which takes a similar form to the above-described embodiments with a sensor region 515 and a CMOS region 511. The IR thermo-sensor comprises a first cover 505 made from a Si wafer with an antireflective region 527 of moth-eye structures and includes a multilayer sidewall 509 that is bonded to the sensor substrate 503 to define a cavity 521 that encapsulates the sensor region 515 and maintains a vacuum environment to help maintain the sensitivity of the sensor components. A second cover 570 comprising a Si substrate with an antireflective region 572 of moth-eye structures is bonded to the upper surface of the first cover 205 via a second sidewall 574 to form a second cavity 576 between the first cover 505 and the second cover 570. The second cover 570 is bonded relative to the first cover 505 such that the two antireflective regions 527, 572 are substantially aligned and positioned above the sensor region 515 so that infrared radiation transmitted through the antireflective regions 527, 572 is incident upon the sensor region 515.

The second sidewall 574 comprises a pair of sub-walls 578, 580 which each comprise multiple layers built upon an adjacent surface of a cover substrate. One sub-wall 578 is built upon the upper surface of the first cover 505 Si substrate and a second sub-wall 580 is built upon the lower surface of the second cover 570 Si substrate. Each sub-wall 576, 578 is formed using the deposition and etching techniques described above and then bonded together via corresponding metal bonding layers to form the second sidewall 574 of the second cavity 572.

Although in the present embodiment the covers 505, 570 are chosen to comprise moth-eye structures, it will be appreciated that one or more covers 505, 570 may comprise a wafer with other characteristics to provide additional functionality. For example, one or more additional wafers could comprise meta lenses, Fresnel lenses, or other optical components such as filters. Advantageously, stacking wafers with different optical characteristics replaces the need for more bulky components with equivalent functionality that are included in conventional designs. Accordingly, the wafer stacking technique of the present invention allows for a smaller, lighter, and more compact IR sensor package to be manufactured without compromising on functionality.

The above embodiments are described by way of example only. Many variations are possible without departing from the scope of the invention as defined in the appended claims.

The invention claimed is:

1. A cover for an infrared detector comprising:
a first cover, the first cover includes
a first cover substrate configured to transmit infrared (IR) radiation, the first cover substrate having first and second opposing first cover surfaces;
a first first cover antireflective region disposed on one of the first and second first cover surfaces, the first first cover antireflective region is configured to enhance transmission of IR radiation through the first cover,
a first wall disposed on the first cover surface surrounding the antireflective region, wherein the first wall extends from the first cover surface; and
a second cover, the second cover includes
a second cover substrate configured to transmit IR radiation, the second cover substrate includes first and second opposing second cover surfaces,
a first second cover antireflective region disposed on one of the first and second second cover surfaces, the first second cover antireflective region is configured to enhance transmission of IR radiation through the second cover,
a second wall of the second cover disposed on the first second cover surface, and
wherein the second wall of the second cover is disposed on the second first cover surface to form a cover stack.

2. The cover of claim 1 wherein:
the first first cover antireflective region comprises a first plurality of first cover antireflective elements; and
the first plurality of first cover antireflective elements are sized and shaped and arranged relative to one another to enhance transmission of IR radiation through the first cover.

3. The cover of claim 2 wherein the first plurality of first cover antireflective elements are disposed on a base of a depression on one of the first and second first cover surfaces.

4. The cover as claimed in claim 2, wherein the first plurality of first cover antireflective elements are configured in a quadratic pattern or a trigonal pattern.

5. The cover of claim 1 wherein:
the first second cover antireflective region comprises a first plurality of second cover antireflective elements; and
the first plurality of second cover antireflective elements are sized and shaped and arranged relative to one another to enhance transmission of IR radiation through the second cover.

6. The cover of claim 5 wherein the first plurality of second cover antireflective elements are disposed on a base of a depression on one of the first and second second cover surfaces.

7. The cover as claimed in claim 5, wherein the first plurality of second cover antireflective elements are configured in a quadratic pattern or a trigonal pattern.

8. The cover of claim 1 further comprises:
a second first cover antireflective region disposed on other of the first and second first cover surfaces; and
the second first cover antireflective region comprises a second plurality of first cover antireflective elements; and
the second plurality of first cover antireflective elements are sized and shaped and arranged relative to one another to enhance transmission of IR radiation through the first cover.

9. The cover of claim 8 wherein the second plurality of first cover antireflective elements are disposed on a base of a depression on the other of the first and second first cover surfaces.

10. The cover as claimed in claim 8, wherein the second plurality of first cover antireflective elements are configured in a quadratic pattern or a trigonal pattern.

11. The cover of claim 1 further comprises:
a second second cover antireflective region disposed on other of the first and second second cover surfaces; and
the second second cover antireflective region comprises a second plurality of second cover antireflective elements; and
the second plurality of second cover antireflective elements are sized and shaped and arranged relative to one another to enhance transmission of IR radiation through the second cover.

12. The cover of claim 11 wherein the second plurality of second cover antireflective elements are disposed on a base of a depression on the other of the first and second second cover surfaces.

13. The cover as claimed in claim 12, wherein the second plurality of second cover antireflective elements are configured in a quadratic pattern or a trigonal pattern.

14. The cover as claimed in claim 1 wherein the first wall comprises a plurality of first wall layers, wherein one layer of the plurality of first layers comprises an oxide layer, and one layer of the plurality of first layers comprises a metallic bonding layer for bonding the cover stack to a sensor device to encapsulate a sensor of the sensor device.

15. The cover as claimed in claim 1 wherein the second wall comprises a plurality of second wall layers.

16. An infrared detector comprising:
a substrate, the substrate includes a sensor region with an IR sensor;
a cover stack encapsulating at least the sensor region of the substrate, wherein the cover stack comprises
a first cover, the first cover is configured to transmit infrared (IR) radiation, the first cover includes
first and second opposing first cover surfaces,
a first first cover antireflective region disposed on one of the first and second first cover surfaces, the first first cover antireflective region is configured to enhance transmission of IR radiation through the first cover,
a first wall disposed on the first cover surface surrounding the antireflective region, wherein the first wall extends from the first cover surface, the first wall is attached to the substrate to encapsulate at least the sensor region; and
a second cover, the second cover configured to transmit IR radiation, the second cover includes
first and second opposing second cover surfaces,
a first second cover antireflective region disposed on one of the first and second second cover surfaces, the first second cover antireflective region is configured to enhance transmission of IR radiation through the second cover,
a second wall of the second cover disposed on the first second cover surface, the second cover wall is attached to the second first cover surface.

17. The device of claim 16 wherein:
the first first cover antireflective region comprises a first plurality of first cover antireflective elements; and
the first plurality of first cover antireflective elements are sized and shaped and arranged relative to one another to enhance transmission of IR radiation through the first cover.

18. The device of claim 16 wherein:
the first second cover antireflective region comprises a first plurality of second cover antireflective elements; and
the first plurality of second cover antireflective elements are sized and shaped and arranged relative to one another to enhance transmission of IR radiation through the first cover.

19. The device of claim 16 further comprises:
a second first cover antireflective region disposed on other of the first and second first cover surfaces; and
the second first cover antireflective region comprises a second plurality of first cover antireflective elements; and
the second plurality of first cover antireflective elements are sized and shaped and arranged relative to one another to enhance transmission of IR radiation through the first cover.

20. The device of claim 16 further comprises:
a second second cover antireflective region disposed on other of the first and second second cover surfaces; and
the second second cover antireflective region comprises a second plurality of second cover antireflective elements; and
the second plurality of second cover antireflective elements are sized and shaped and arranged relative to one another to enhance transmission of IR radiation through the second cover.

21. The device as claimed in claim 16 wherein the first wall comprises a plurality of first wall layers, wherein one layer of the plurality of first layers comprises an oxide layer, and one layer of the plurality of first layers comprises a metallic bonding layer for bonding the cover stack to the substrate.

* * * * *